United States Patent
Zhu et al.

(10) Patent No.: US 8,742,864 B2
(45) Date of Patent: Jun. 3, 2014

(54) METHOD AND DIGITAL CIRCUIT FOR GENERATING A WAVEFORM FROM STORED DIGITAL VALUES

(75) Inventors: Zhi Zhu, San Diego, CA (US); Xiaohua Kong, San Diego, CA (US); Nam V. Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 215 days.

(21) Appl. No.: 12/939,206

(22) Filed: Nov. 4, 2010

(65) Prior Publication Data
US 2012/0112809 A1    May 10, 2012

(51) Int. Cl.
*H03C 3/06* (2006.01)
(52) U.S. Cl.
USPC ........... 332/127; 331/16; 331/23; 332/128
(58) Field of Classification Search
USPC ............ 332/127, 128; 331/16, 23; 375/130, 375/376; 327/159
See application file for complete search history.

(56) References Cited

U.S. PATENT DOCUMENTS

| | | | | |
|---|---|---|---|---|
| 5,825,257 A | * | 10/1998 | Klymyshyn et al. | 332/100 |
| 5,834,987 A | * | 11/1998 | Dent | 332/127 |
| 6,292,507 B1 | * | 9/2001 | Hardin et al. | 375/130 |
| 6,294,936 B1 | | 9/2001 | Clementi | |
| 7,117,234 B2 | | 10/2006 | Khlat | |
| 7,308,596 B1 | | 12/2007 | Hwang et al. | |
| 7,443,389 B1 | | 10/2008 | Alben | |
| 7,443,905 B1 | * | 10/2008 | Llewellyn et al. | 375/130 |
| 7,477,676 B2 | | 1/2009 | Kokubo et al. | |
| 2003/0137359 A1 | | 7/2003 | Patana | |
| 2008/0107154 A1 | | 5/2008 | Hsiao-Chyi | |
| 2008/0224789 A1 | * | 9/2008 | Chang et al. | 332/127 |

OTHER PUBLICATIONS

International Search Report and Written Opinion—PCT/US2011/059246—ISA/EPO—Feb. 15, 2012.
Written Opinion of the International Preliminary Examining Authority—PCT/US2011/059246—ISA/EPO—Nov. 30, 2012.

* cited by examiner

*Primary Examiner* — Joseph Chang
(74) *Attorney, Agent, or Firm* — Sam Talpalatsky; Nicholas J. Pauley; Joseph Agusta

(57) ABSTRACT

In a particular embodiment, a method includes adjusting an input to a divider on a feedback path of a phase locked loop circuit based on a stored digital value representing a portion of a time-based waveform that is applied to a modulator circuit. The stored digital value is retrieved based on an output of the feedback path.

40 Claims, 8 Drawing Sheets

METHOD AND DIGITAL CIRCUIT FOR GENERATING A WAVEFORM FROM STORED DIGITAL VALUES

I. FIELD

The present disclosure is generally related to a method and digital circuit for generating a waveform from stored digital values.

II. DESCRIPTION OF RELATED ART

Advances in technology have resulted in smaller and more powerful computing devices.

For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Portable computing devices may include a clock synchronization circuit, such as a phase-locked loop (PLL) and a delay-clocked loop (DLL), to generate an output clock signal whose phase is synchronized with an input clock (e.g., a system clock). The clock synchronization circuit may be configured to use a frequency divider in the feedback path, where the frequency divider is driven by a modulator that generates a value from a fixed seed value. However, the output clock signal that is generated by such circuits may have a large power density at a single frequency resulting in electromagnetic interference (EMI).

III. SUMMARY

A waveform generator having a memory for storing digital values may be used. The digital values are used by the waveform generator to construct a waveform. The waveform may take on a desired shape and may be changed or modified by storing new or modified digital values in the memory. The set of stored digital values may be overwritten, or the memory may allow multiple sets of digital values to be written, where each set represents a unique waveform. In the case of multiple sets of stored digital values, the particular set of stored digital values used to construct the waveform may be selected based on an index value, an identifier, or in some other manner. The waveform and a seed value are combined in a manner to spread the power density of an output clock over a particular frequency band. The signal-to-noise ratio (SNR) of the output clock may be improved by selecting a waveform, such as a sinusoidal waveform, that provides a faster rol I-off of power density outside the particular frequency band.

The waveform generator may be used in conjunction with a digital modulator to drive a frequency divider of a phase locked loop (PLL) in order to spread the power density of the PLL output clock signal over a particular frequency band. In a particular embodiment, a method adjusts an input to a frequency divider on a feedback path of a phase locked loop circuit based on a stored digital value. The stored digital value represents a portion of a time-based waveform that is applied to a modulator circuit. The stored digital value is retrieved based on an output of the feedback path.

In another particular embodiment, a digital circuit includes a digital modulator responsive to a seed input where the digital modulator has an output to drive a frequency divider. The digital circuit includes a waveform generator coupled to an output of the frequency divider where the waveform generator includes a memory that stores digital values used to generate a waveform. The seed input of the digital modulator is determined based on the waveform and a fixed seed value.

One particular advantage provided by at least one of the disclosed embodiments is that a waveform with a desired shape to be applied to a modulator coupled to a frequency divider may be implemented by storing appropriate digital values in a memory. The waveform of the desired shape may be selected for improved performance characteristics of the PLL.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

A clock synchronization circuit, such as a PLL, may be used to generate an output clock that is locked to a received reference clock. A feedback path of the clock synchronization circuit may include a frequency divider (e.g., a UN divider) that is driven by a digital modulator. The digital modulator may be responsive to a seed value to drive the frequency divider. Electromagnetic interference (EMI) is reduced at the output clock by providing a seed value to the digital modulator that is a combination of a fixed value and a modulation value. A waveform generator at the clock synchronization circuit generates the modulation value from digital values stored in a memory, where the digital values may be selected for the generated waveform to take on a desired shape. The combined seed causes the average divisor value, N, of the frequency divider to vary over a small range. As a result, power density at the output clock can be spread over a small frequency band instead of being concentrated at a single frequency.

Figure 1:
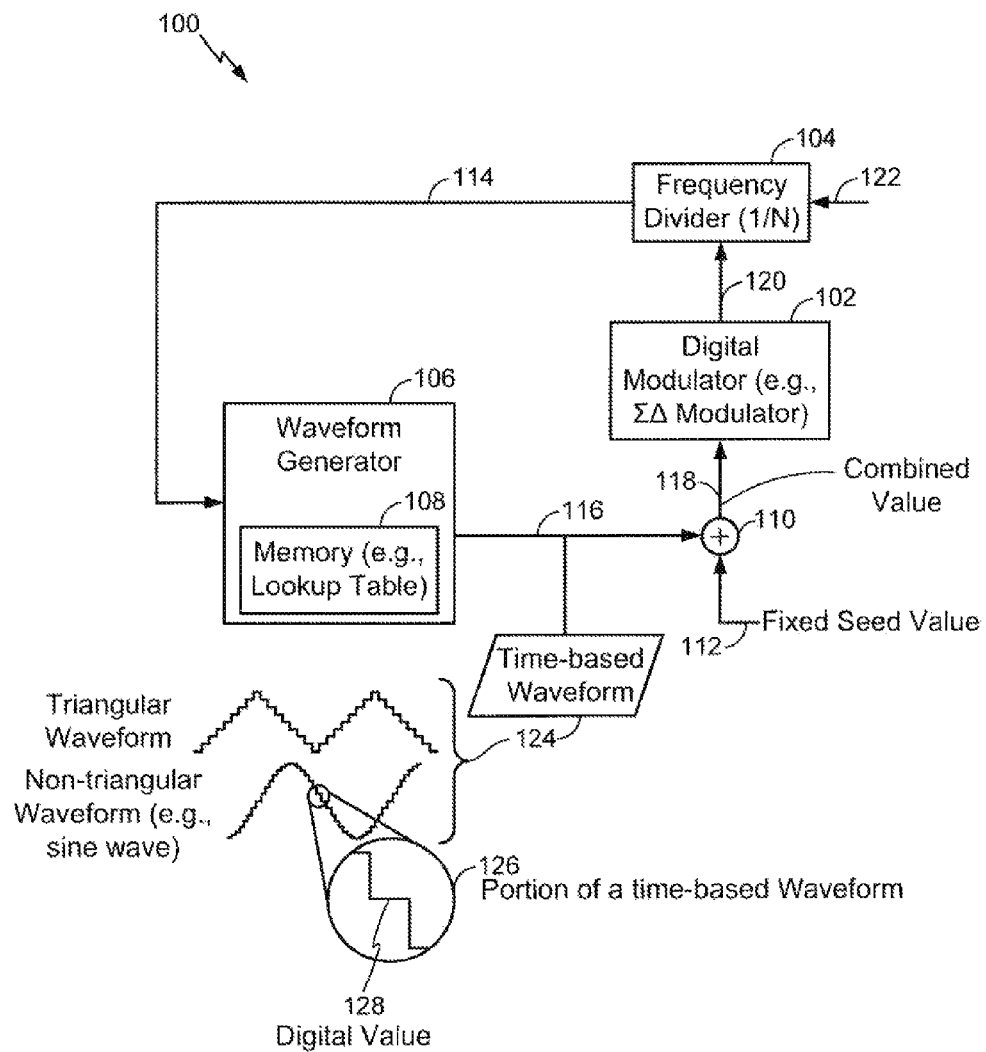
FIG. 1 is a block diagram of a particular illustrative embodiment of a digital circuit to modulate a fixed seed value with a waveform generated from stored values.

Referring to FIG. 1, a particular illustrative embodiment of a digital circuit to modulate a fixed seed value with a waveform generated from stored values is disclosed and generally designated 100. The digital circuit 100 includes a digital modulator 102, a frequency divider (1/N) 104, a waveform generator 106, a memory 108, and an adder 110.

In a particular illustrative embodiment, the memory 108 stores digital values that may be used to generate a time-based waveform 124. For example, a digital value 128 is represented as a portion 126 of the time-based waveform 124. The time-based waveform 124 may be a triangular waveform or a non-triangular wave form, such as a sine wave, illustrated as alternative embodiments of the time-based waveform 124 in FIG. 1. The time-based waveform 124 may be provided from the waveform generator 106 to the adder 110 via a data path 116. The adder 110 may also be provided with a fixed seed value via a data path 112. The output of the adder 110 may be a seed input (e.g., a combined value) provided to the digital modulator 102, such as a sigma-delta (ΣΔ) modulator via a data path 118. The digital modulator 102 receives the seed input and generates an output to drive the frequency divider 104. The output of the digital modulator 102 may be provided to the frequency divider 104 via a data path 120 and provides a value "N" such that the frequency divider 104 divides an input signal received via a data input 122 by N. The output of the frequency divider 104 may be provided to the waveform generator 106 via a data path 114. The output of the frequency divider 104 may be used by the waveform generator 106 as an input clock signal.

In a particular embodiment, the memory 108 may be located in the waveform generator 106 or external to the waveform generator 106. The digital values stored in the memory 108 may be discrete digital values configured to construct the digital time-based waveform 124. For example, the discrete values may be configured to form a sinusoidal waveform. The stored digital values in the memory 108 may be modified or overwritten with new values. The memory 108 may include multiple sets of digital values where each set is configured to form a different waveform.

Each unique waveform has a unique frequency spectrum that may provide certain advantages or disadvantages over other waveforms. The digital circuit 100 allows the generated waveform to take on any desired shape so that the waveform may be customized for the particular application or operating mode (e.g., a particular application may require a fast roll-off). The digital circuit 100 also allows the shape of the generated waveform to be modified or changed, which may be desirable as applications or environmental factors change.

Figure 2:
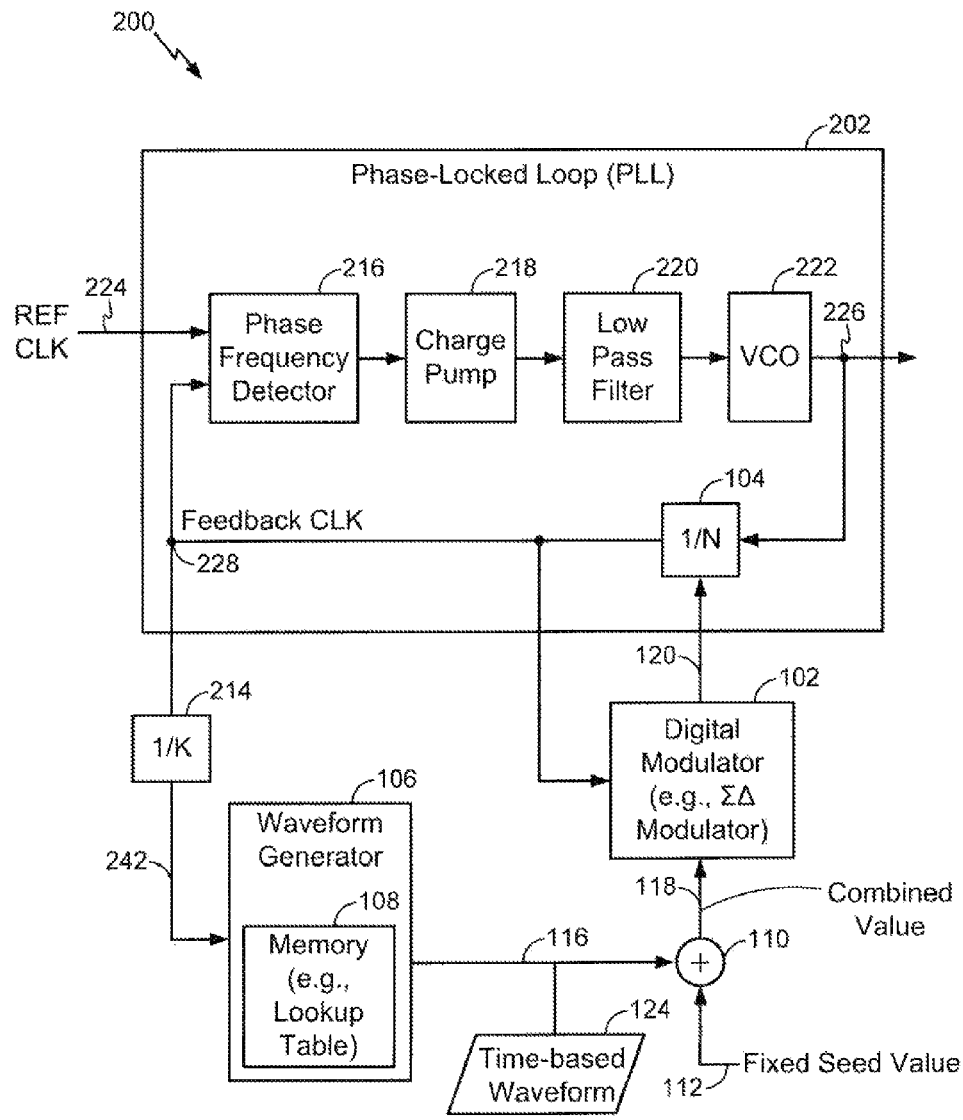
FIG. 2 is a block diagram of a second particular illustrative embodiment of a digital circuit to modulate a fixed seed value with a waveform generated from stored values.

The frequency divider (1/N) 104 receives the input signal via the data path 122. The input signal may be an output signal of a clock synchronization circuit, such as a PILL, where the frequency divider (1/N) 104 forms part of the clock synchronization circuit feedback path. For example, the output of the frequency divider 104 may be provided as a feedback signal to a phase frequency detector 216 of a PLL 202, as depicted in FIG. 2. The output of the frequency divider (1/N) 104 is also provided to the waveform generator 106 and may be used by the waveform generator 106 as a clock signal. The waveform generator 106 generates the time-based waveform 124 using the digital values stored in the memory 108. The time-based waveform 124 may represent a time-varying modulation seed that is combined with the fixed seed value at the adder 110 to form the combined value provided to the digital modulator 102 via the data path 118. The digital modulator 102 provides the divisor, N, to the frequency divider (1/N) 104 based on the combined value. The time-based waveform 124 causes the value of the divisor, N, to vary over a range such that the frequency of the output of the frequency divider (1/N) 104 varies over a corresponding range.

Referring to FIG. 2, a particular illustrative embodiment of a digital circuit to modulate a fixed seed value with a waveform generated from stored values is disclosed and generally designated 200. The digital circuit 200 includes the digital modulator 102, the frequency divider 104, the waveform generator 106, the memory 108, and the adder 110 of FIG. 1. The digital circuit 200 also includes a second frequency divider (1/K) 214 and a phase-locked loop (PLL) 202. The PLL 202 may include a phase frequency detector 216, a charge pump 218, a low pass filter 220, a voltage controlled oscillator (VCO) 222, and the frequency divider (1/N) 104.

The phase frequency detector 216 may be configured to receive a reference clock signal via a data path 224 and a feedback clock signal from the frequency divider (1/N) 104 via a data path 228. The phase frequency detector 216 may be configured to compare the two input signals and provide an error signal to the charge pump 218 based on the difference between the two input signals. The error signal may be provided to the charge pump 218 and may either increase or decrease the voltage output of the charge pump 218. The voltage at the output of the charge pump 218 may be provided to the low pass filter 220 and to the VCO 222. The VCO 222 provides an output signal, such as an output clock signal, whose frequency corresponds to, the input voltage received from the charge pump 218. The output signal from the VCO 222 may be provided as an input signal to the frequency divider (1/N) 104 via a data path 226. The frequency divider (1/N) 104 may also receive the output of the digital modulator 102 via a data path 120. The output of the digital modulator 102 may provide the value N for the frequency divider (1/N) 104, where the value N is the value by which the input signal of the frequency divider (1/N) 104 is divided.

The output of the frequency divider (1/N) 104 may be the feedback clock signal provided to the phase frequency detector 216 via the data path 228. The feedback clock signal may also be provided to the digital modulator 102 as, for example, a clock input to the digital modulator 102. The feedback clock signal may also be provided to the second frequency divider (1/K) 214 via the data path 228. A divided by K feedback clock signal may be provided as an input to the waveform generator 106 via a data path 242. The second frequency divider (1/K) 214 may be used to reduce the frequency of the feedback clock signal at the data path 228 for use as a clock signal for the waveform generator 106.

As a result of the combination, the combined seed value provided to the digital modulator 102 via the data path 118 varies over a range determined by the time-based waveform 124. The digital modulator 102 provides an average divisor value, N, such that the average will vary over a range of values corresponding to the variation in frequency of the time-based waveform 124. As a result of the variation in the average divisor value, the feedback clock will vary over a frequency range. The variation in the feedback frequency will propagate through to the VCO 222 resulting in output signal at the VCO 222 that also varies over a frequency range. If the output signal at the VCO 222 did not vary over a frequency range, the power density of the output signal would be concentrated around a single frequency and would be more susceptible to EMI. When the output signal of the VCO 222 is varied over the frequency range, the power density at the output signal is spread over the frequency range and can be less susceptible to EMI.

The time-based waveform 124 generated by the waveform generator 106 may be programmable and not limited to a particular shape, and as such, each unique waveform has a unique frequency spectrum that may provide certain advantages or disadvantages over other waveforms. The digital circuit 200 allows the generated waveform (i.e., the waveform from the waveform generator 106) to take on a desired shape so that the output of the PLL 202 may be customized for the particular application (e.g., a particular application may require a fast roll-off at the output clock signal of the VCO 222). The digital circuit 200 also allows the shape of the generated waveform to be modified or changed, which may be desirable as applications or environmental factors change.

Figure 3:
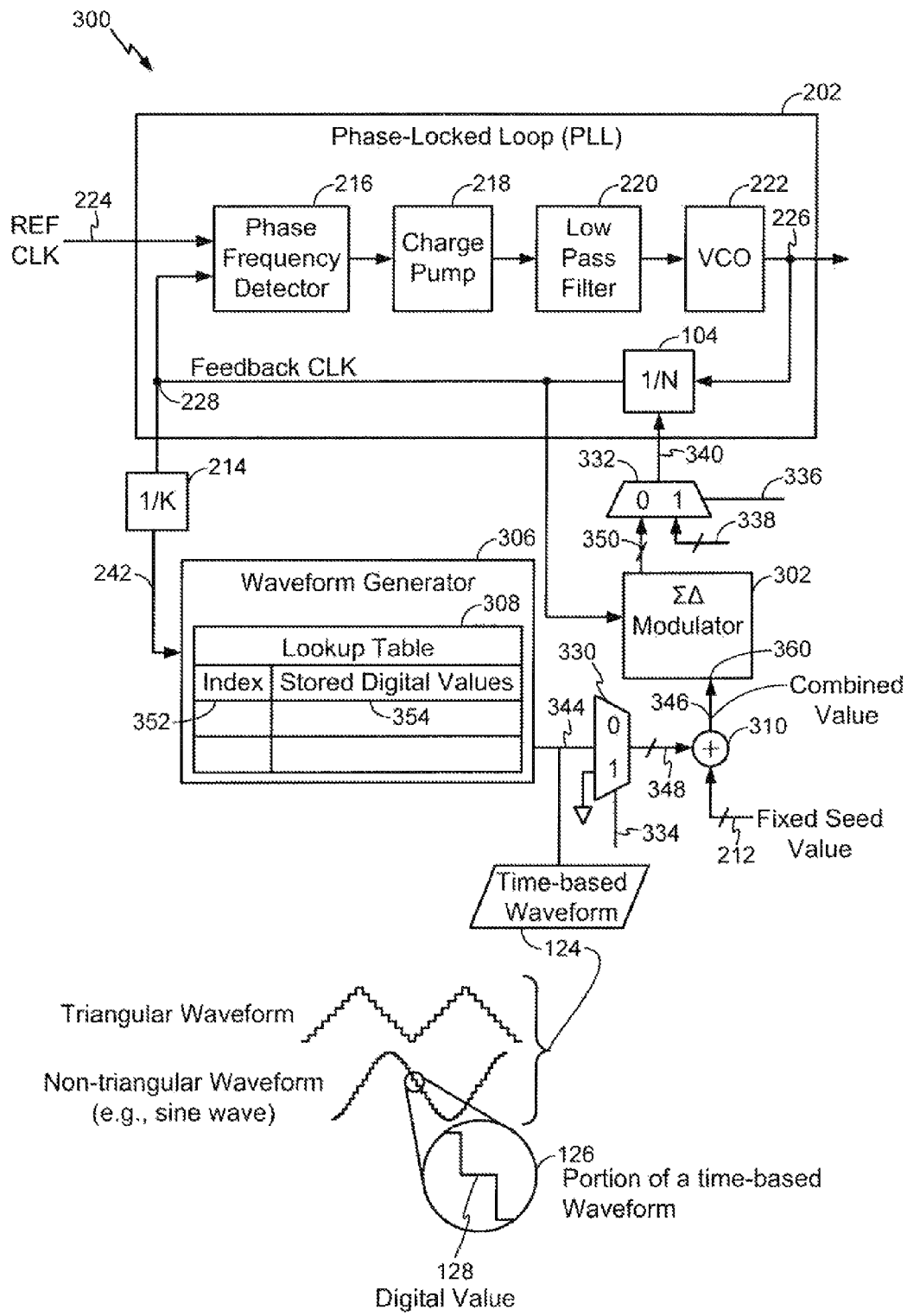
FIG. 3 is a block diagram of a third particular illustrative embodiment of a digital circuit to modulate a fixed seed value with a waveform generated from stored values.

Referring to FIG. 3, a particular illustrative embodiment of a digital circuit to modulate a fixed seed value with a waveform generated from stored values is disclosed and generally designated 300. The digital circuit 300 includes a sigma-delta modulator 302, a waveform generator 306 that includes a look-up table 308, an adder 310, a first bypass multiplexer (MUX) 330, a second bypass MUX 332, the second frequency divider (1/K) 214, and the PLL 202 (as shown in FIG. 2). The PLL 202 includes the phase frequency detector 216, the charge pump 218, the low pass filter 220, the VCO 222, and the frequency divider (1/N) 104.

The waveform generator 306 may include the look-up table 308 for storing one or more sets of digital values that are used to generate the digital waveforms. Each stored digital value may include an index 352 and a stored digital value 354. The waveform generated from the stored digital values may be provided to the first bypass MUX 330 via a data path 344. The first bypass MUX 330 includes a selection control 334 for selecting between a first input and a second input, where the first input includes the waveform provided via the data path 344 and the second input is a logic level zero (e.g., ground). Alternatively, the second input may be a logic level one or any type of digital signal provided by another source. The signal selected by the first bypass MUX 330 is provided to the adder 310 via a data path 348. For example, the waveform provided by the waveform generator 306 may be a series of digital values that are selected at the first bypass MUX 330 and provided to the adder 310. The waveform provided to the adder 310 via the data path 348 may be applied to the adder 310 as a modulation seed. The fixed seed value may be provided to the adder 310 via the data path 212.

The adder 310 combines the fixed seed value and the modulation seed to provide a combined value to a control input 360 of the sigma-delta modulator 302 via a data path 346. The sigma-delta modulator 302 may be a third order sigma-delta modulator, or of any other order. The sigma-delta modulator 302 outputs a value to the second bypass MUX 332 via a data path 350. The second bypass MUX 332 includes a selection control 336 for selecting between a first input and a second input, where the first input includes the value provided by the sigma-delta modulator 302 via the data path 350. The second input to the second bypass MUX 332 may be a bypass value provided by another source via a data path 338. The value selected by the second bypass MUX 332 is provided to the frequency divider (1/N) 104 via a data path 340. For example, the value provided by the sigma-delta modulator 302 may be selected by the second bypass MUX 332 and provided to the frequency divider (1/N) 104. The value received by the frequency divider (1/N) 104 from the second bypass MUX 332 is used to divide the output signal of the VCO 222.

The waveform generator 306 generates a time-based waveform 124 based on the stored digital values 354 stored in the lookup table 308. The stored digital values 354 may be indexed to be accessible via a corresponding lookup table index 352. In a particular embodiment, the lookup table 308 includes sixty-four entries with corresponding index values of 0-63, where each index value corresponds to one of sixty-four steps in the period of the time-based waveform 124. The waveform generator 306 may be configured to retrieve the stored digital values 354 in numerical order of the lookup table index 352 for each period of the time-based waveform 124. For example, the first stored digital value selected when generating the waveform may correspond to index 0 and the last digital value selected for one period may correspond to index 63. In this particular embodiment, each index value in the lookup table index 352 may be at least a 6-bit value. The bit width of the stored digital values 354 may vary based on the number of steps per period in the generated waveform and the waveform shape. For example, a sine waveform with 64 steps per period may require a larger bit value for the stored digital values 354 than a triangle waveform with 64 steps per period because the step size of the sine waveform may be different for each step, whereas the step size for each step in the triangle waveform is the same. For example, each stored digital value in the lookup table index 352 for a triangle waveform with 64 steps per period may be at least a six bit value, whereas each stored digital value in the lookup table index 352 for a sine waveform with 64 steps per period may be at least a 13-bit value. The size of the lookup table 308 is not limited to 64 entries, but may be any size. Also, the bit values for the lookup table index 352 and the stored digital values 354 are not limited to the values disclosed, but may be any size. The operation of the digital circuit 300 will be further described with reference to FIG. 4.

The lookup table 308 that provides the waveform generator 306 with quick and easy access to the stored digital values 354 by incrementing the lookup table index 352 with the clock output of the second frequency divider (1/K) 214 and also enables programming to change the time-based waveform 124. The digital circuit 300 includes first and second bypass MUXs 330 and 332 for circuit manipulation and testing. The first bypass MUX 330 may prevent the time-based waveform 124 from being combined with the fixed seed value so that only the fixed seed value is provided to the sigma-delta modulator 302. The effects of the time-based waveforms on the digital circuit 300 may be measured by examining the output of the VCO 222 with and without the input of the time-based waveform 124 at the adder 310. The second bypass MUX 332 may also be provided to keep the sigma-delta modulator 302 from driving the frequency divider (1/N) 104. Instead, a value from another source (e.g., another circuit on the die or a source external to the die) may be provided to drive the frequency divider (1/N) 104 as part of a test procedure or a change in the mode of operation.

Figure 4:
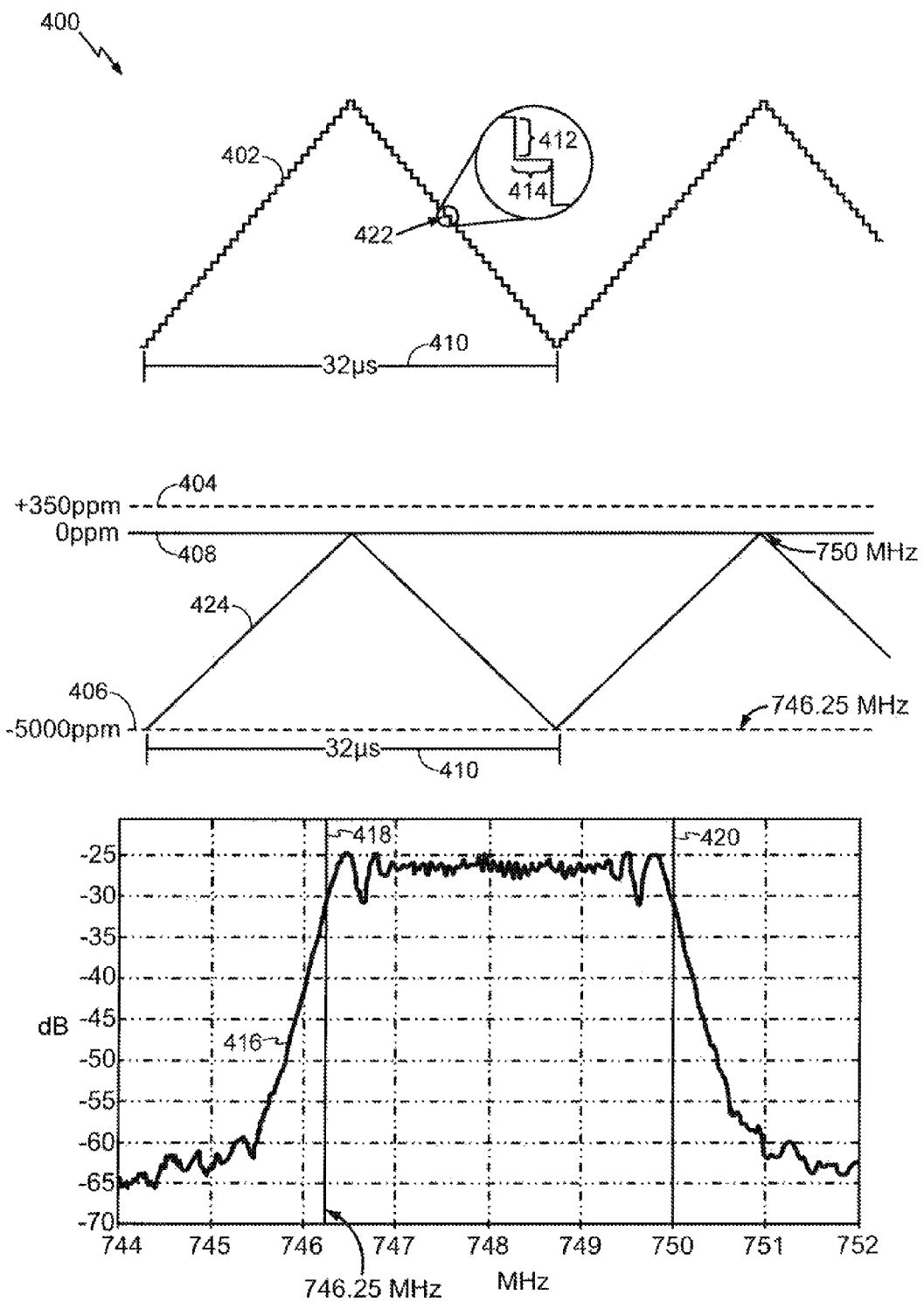
FIG. 4 is a waveform diagram of a particular illustrative embodiment of a triangle waveform generated from stored values and a corresponding modulation output spectrum.

Referring to FIG. 4, a particular illustrative embodiment of a waveform generated from stored values, a waveform tracking the frequency change at a VCO output, and a corresponding output spectrum is illustrated and generally designated 400. The waveform is a triangle waveform 402 generated from a plurality of stored digital values. The stored digital values may provide the triangle waveform 402 with an equal number of steps up and steps down, where each step has the same width and size.

In a particular illustrative embodiment, the waveform generator 106 of FIGS. 1-2 or the waveform generator 306 of FIG. 3 may be used to provide spread spectrum clocking (SSC) for Serial Advanced Technology Attachment (SATA) standards. The spread spectrum requirements for SATA may limit the SSC to a spreading of approximately 5000 parts per million (ppm) and a modulation rate of approximately 30-33 kHz. The spreading may be implemented as up spreading (e.g., 0 to +5000 ppm), center spreading (e.g., +/−2500 ppm), or down spreading (e.g., 0 to −5000 ppm). The triangle waveform 402 illustrated in FIG. 4 is processed to result in down spreading; however, other forms of spreading may be used. Waveform 424 illustrates the change in frequency of the output of the VCO 222 of FIG. 3 in response to the use of the triangle waveform 402 as the modulation seed (e.g., the time-based waveform 124). An upper limit 404 for the down spreading implementation may be +350 ppm while a lower limit 406 may be −5000 ppm. In the illustration provided, the waveform 424 moves between a zero axis 408 at zero ppm and the lower limit 406 at −5000 ppm. A period 410 of the triangle waveform 402 and the waveform 424 may be 32 microseconds, which translates into a frequency of approximately 32 kHz. The triangle waveform 402 illustrated in FIG. 4 has sixty-four (64) steps per period 410 (e.g., 32 steps up and 32 steps down). An illustrative step 422 has a duration 414 of 0.5 microseconds and a size 412. Further, each of the 64 steps of the triangle waveform 402 may have the same duration 414 and size 412.

However, the triangle waveform 402 may be implemented with more or fewer steps per period 410. If more than 64 steps are used, the duration 414 and size 412 of each step may be reduced to fit within the period 410 and spread range. If fewer steps than 64 are used, the duration 414 and size 412 of each step may be increased to fit within the period 410 and spread range (e.g., the change in amplitude of the triangle waveform that results in a 5000 ppm, or a 0.05%, change in frequency at the output of the VCO). A separate stored value may be provided for each step in the memory 108 of FIGS. 1-2 or in the look-up table 308 of FIG. 3.

Alternatively, a single stored value may account for two steps, one step on the rising portion of the triangle waveform 402 and one step on the falling portion of the triangle waveform 402. For example, the fourth step from the top of the triangle waveform 402 on the rising portion and the fourth step from the top on the falling portion may have at the same value but be positioned on different slopes of the waveform. Therefore, the same stored value may be used for two steps within the period 410. As such, the triangle waveform 402 having 64 steps may be implemented with 64 stored values or fewer than 64 stored values (e.g., 32 stored values).

FIG. 4 also includes an output spectrum 416 seen at the output of the VCO 222 of FIG. 3 in which the triangle waveform 402 has been used as a modulation seed summed with a fixed seed that corresponds to 750 MHz. For example, the modulation seed and the 750 MHz fixed seed may be summed at the adder 110 of FIGS. 1-2, or the adder 310 of FIG. 3. If the modulation seed were not combined with the 750 MHz fixed seed, the output spectrum at the VCO 222 output would have a single tone at 750 MHz with a large peak power density. In many applications, a large peak power density at a single tone causes an undesirable degree of electromagnetic interference (EMI). The addition of the modulation seed spreads the power density over a small frequency band and significantly reduces the EMI. As illustrated in FIG. 4, the majority of the power density is spread between an upper marker 420 at 750 MHz and a lower marker 418 at 746.25 MHz. The range of 750 MHz to 746.25 MHz corresponds to a 5000 ppm change induced by the modulation seed (e.g., the triangle waveform 402). The −5000 ppm variation provided by the modulation seed is equivalent to a −0.5% change (e.g., $$\left(\text{e.g., } \frac{-5000}{1000000} \times 100\% = -0.5\%\right).$$

The −0.5% change of 750 MHz results in a 3.75 MHz $$\left(\text{e.g., } 750 \text{ MHz} \times \frac{-0.5\%}{100\%} = -3.75 \text{ MHz}\right)$$

drop, or a drop to 746.25 MHz (e.g., 750 MHz−3.75 MHz=746.25 MHz).

While most of the power density is between the upper marker 420 at 750 MHz and the lower marker 418 at 746.25 MHz, there is still power above the upper marker 420 and below the lower marker 418. Although the EMI has been greatly reduced, the area under the modulation output spectrum 416 above 750 MHz and below 746.25 MHz represents noise, which causes some degree of interference. The larger the area in these regions the greater the noise, resulting in a lower signal-to-noise ratio (SNR). Some of the noise in these regions is a result of the multiple harmonics associated with triangle waves. Other waveforms may be used to further reduce the area in these regions of noise.

Figure 5:
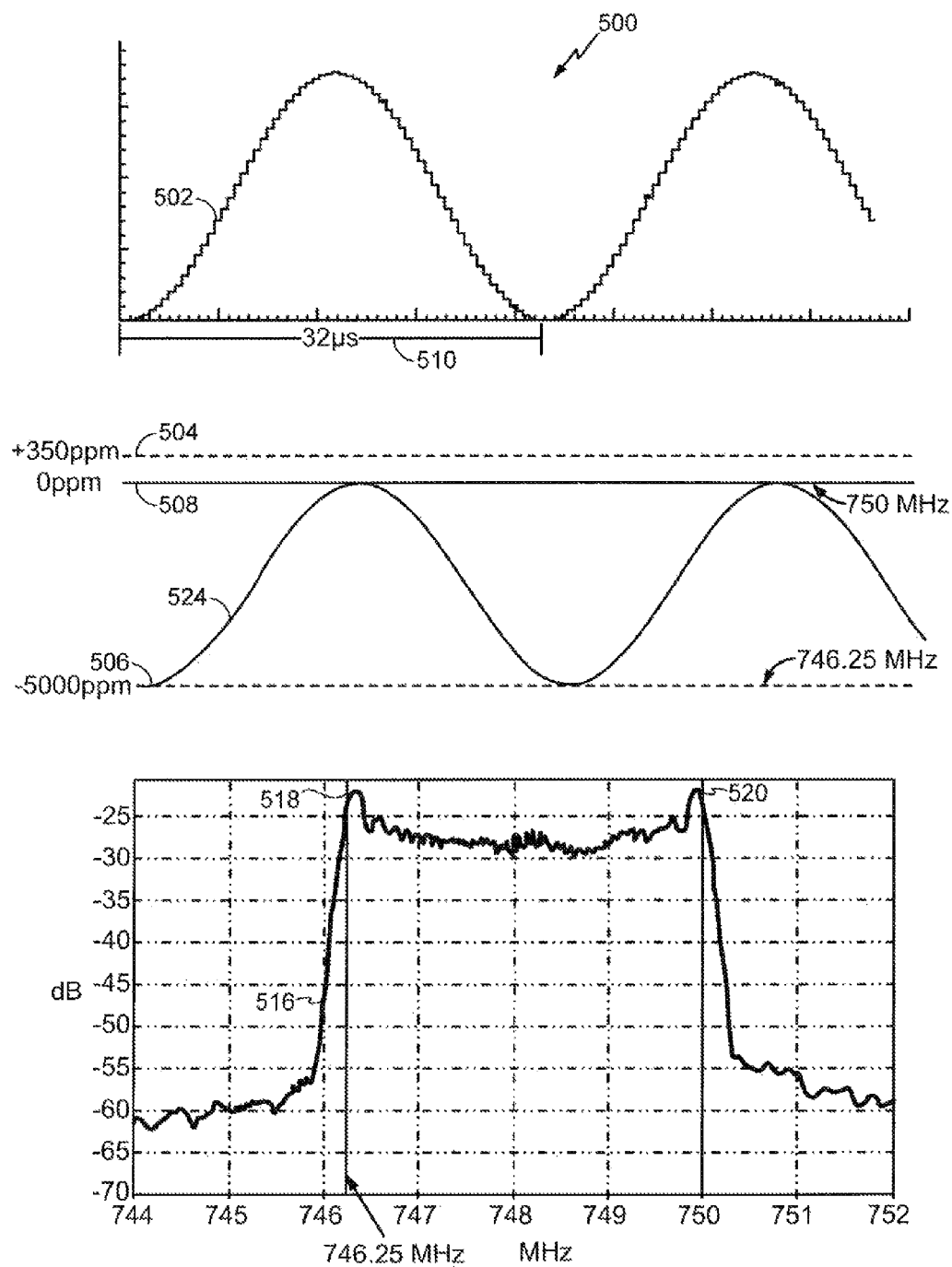
FIG. 5 is a waveform diagram of a second particular illustrative embodiment of a sinusoidal waveform generated from stored values and a corresponding modulation output spectrum.

Referring to FIG. 5, a particular illustrative embodiment of a waveform generated from stored values, a waveform tracking the frequency change at a VCO output, and a corresponding output spectrum is illustrated and generally designated 500. The waveform is a sinusoidal (sine) waveform 502 generated from a plurality of stored digital values. The stored digital values may provide the sine waveform 502 with an equal number of steps up and steps down, where each step has the same width, but vary in step size. One advantage of the sine waveform 502 is that an ideal sine waveform has a single tone with no harmonics.

In a particular illustrative embodiment, the sine waveform 502 illustrated in FIG. 5 is processed to result in down spreading; however, other forms of spreading may be used. Waveform 524 illustrates the change in frequency of the output of the VCO 222 of FIG. 3 in response to the use of the sine waveform 502 as the modulation seed (e.g., the time-based waveform 124). An upper limit 504 for the down spreading implementation may be +350 ppm while a lower limit 506 may be −5000 ppm. In FIG. 5, the waveform 524 moves between a zero axis 508 at zero ppm and the lower limit 506 at −5000 ppm. A period 510 of the sine waveform 502 and the waveform 524 may be approximately 32 microseconds, which translates into a frequency of approximately 32 kHz. The sine waveform 502 illustrated in FIG. 5 has sixty-four (64) steps per period 510 (e.g., 32 steps up and 32 steps down), where the duration of each step is 0.5 microseconds and the size of the steps vary to form the sinusoidal shape. For example, the step size is smallest at the peaks of the sine waveform 502 and largest where the slope of the sine waveform 502 is greatest.

However, the sine waveform 502 may be implemented with more or fewer steps per period 510. If more than 64 steps are used, the duration and size of each step may be reduced to fit within the period 510 and spread range. If fewer steps than 64 are used, the duration and size of each step may be increased to fit within the period 510 and spread range. A separate stored value may be provided for each step in the memory 108 of FIGS. 1-2 or to the look-up table 308 of FIG. 3.

Alternatively, a single stored value may account for two steps, one step on the rising portion of the sine waveform 502 and one step on the falling portion of the sine waveform 502. For example, the sixteenth step from the top of the sine waveform 502 on the rising portion and the sixteenth step from the top of the sine waveform 502 on the falling portion may be at the same value, but positioned on different slopes. Therefore, the same stored value may be used for two steps within the period 510. As such, the sine waveform 502 having 64 steps may be implemented with 64 stored values or fewer than 64 stored values (e.g., 32 stored values).

FIG. 5 also includes an output spectrum 516 seen at the output of the VCO 222 of FIG. 3 in which the sine waveform 502 has been used as a modulation seed summed with a MHz fixed seed. As previously explained, the addition of the modulation seed spreads the power density at the output of the VCO 222 of FIG. 3 over a small frequency band and significantly reduces the EMI. As illustrated in FIG. 5, the majority of the power density is spread between an upper marker 520 at 750 MHz and a lower marker 518 at 746.25 MHz. As previously explained with respect to FIG. 4, the range of the 750 MHz to 746.25 MHz frequency band results from the −5000 ppm variation at the output of the VCO 222 provided by the modulation seed.

While most of the power density is between the upper marker 520 at 750 MHz and the lower marker 518 at 746.25 MHz, there is power above the upper marker 520 and below the lower marker 518. However, compared to the modulation output spectrum 416 of the triangle waveform 402, the slope, or roll-off, of the modulation output spectrum 516 of the sine waveform 502 is sharper. The sharper slope of the modulation output spectrum 516 results in less area in the regions of noise, and therefore, less noise. Therefore, use of the sine waveform 502 will further improve the SNR as compared to the implementation utilizing the triangle waveform 402.

Even though the sine waveform 502 of FIG. 5 has a sharper roll-off than the triangle waveform 402 of FIG. 4, the power density of the triangle waveform 402 is more stable within the frequency band (e.g., 750 MHz to 746.25 MHz), which may be more desirable than a sharper roll-off for certain applications. Although the 750 MHz to 746.25 MHz range is listed as an example compliant with SATA, in other embodiments, other values may be chosen. The illustrated waveforms, values, and output spectra are provided for ease of illustration and clarity of explanation. Variations, such as noise, rounding errors, and other factors may arise during implementation. As such, the embodiments depicted in FIGS. 4-5 are to be considered illustrative and not limiting.

Figure 6:
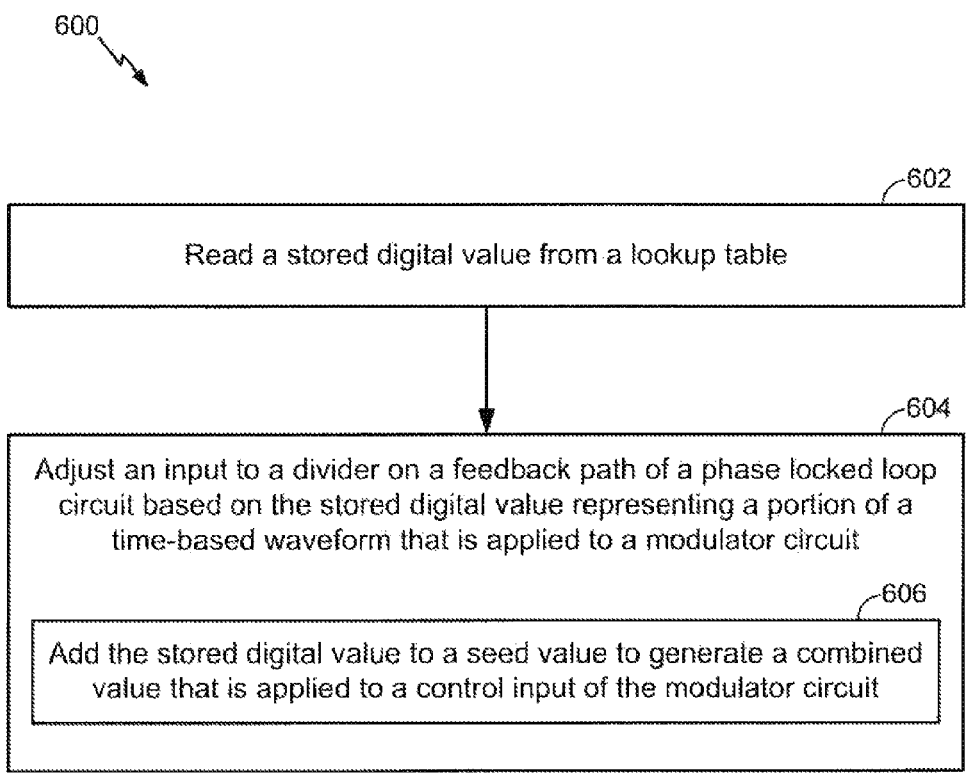
FIG. 6 is a flow chart of a particular illustrative embodiment of a method of generating a waveform from stored digital values to modulate a fixed seed value.

Referring to FIG. 6, a particular embodiment of a method 600 of generating a waveform from stored digital values to modulate a fixed seed value is illustrated. The method 600 may include reading a stored digital value from a lookup table, at 602. For example, the waveform generator 306 of FIG. 3 includes the look up table 308 for storing digital values, such as the stored value 354 with the corresponding index 352. The lookup table index 352 may be used to determine the particular stored digital value read from the lookup table 308. The digital values stored in the look up table 308 may be read by the waveform generator 306 and used to generate the time-based waveform (e.g., the triangle waveform 402 of FIG. 4 or the sine waveform 502 of FIG. 5).

The method 600 may further include adjusting an input to a divider on a feedback path of a phase locked loop circuit based on a stored digital value representing a portion of a time-based waveform that is applied to a modulator circuit, at 604. For example, the waveform generator 106 of FIG. 1 includes the memory 108 that stores digital values for generating a time-based waveform. The time-based waveform is generated by the waveform generator 106 based on the stored digital values. The time-based waveform may be applied to the modulator circuit by adding the time-based waveform to a fixed seed value to generate a combined value that is applied to a control input of the modulator circuit. For example, the digital modulator 102 drives the frequency divider (1/N) 104 based on the variation of the time-based waveform where the frequency divider (1/N) 104 is part of a feedback loop in the PLL 202 of FIGS. 2 and 3. As illustrated in FIG. 3, the modulator circuit may include the sigma-delta modulator 302. The stored digital values may be retrieved from the lookup table 308 based on the output of the feedback path. For example, the output of the frequency divider (1/N) 104, the feedback clock signal, may be provided to the second frequency divider (1/K) 214 via the data path 228, and the output of the second frequency divider (1/K) 214 may be provided to the waveform generator 306. The divided by K feedback clock signal may be provided as a clock signal to the waveform generator 306, and as such, the stored values are retrieved based on the output of the feedback path. Further, the divided by K feedback clock signal may be provided as a clock signal to the look up table 308 of FIG. 3.

The method 600 may further include adding the stored digital value to a seed value to generate a combined value that is applied to a control input of the modulator circuit, at 606. For example, the stored digital value that is part of the time-based waveform generated by the waveform generator 306 of FIG. 3 is provided to the adder 310. Also provided to the adder 310 is the fixed seed value. The stored digital value of the time-based waveform is added to the fixed seed value at the adder 310 to form a combined value. The combined value may be provided to the control input 360 of the sigma-delta modulator 302 via the data path 340.

The stored values 354 in the lookup table 308 of FIG. 3 may be updated to represent a customized waveform. For example, a first set of stored values may be used by the waveform generator 306 to generate a triangle waveform (e.g., the triangle waveform 402 of FIG. 4). The first set of stored values may be updated (e.g., replaced or rewritten) with a second set of values that may be used by the waveform generator 306 to generate a sinusoidal waveform (e.g., the sine waveform 502 of FIG. 5). However, the waveform generated by the waveform generator 306 is not limited to a triangle or sinusoidal waveform. Furthermore, the lookup table 306 need not be limited to a single set of stored values, but may include multiple sets of stored values for generating different waveforms, where the waveform to be generated is based on the index values corresponding to the selected set of stored values.

In a particular embodiment, the method of FIG. 6 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, adjusting the input to the divider may be performed at a processor integrated into an electronic device. In a particular embodiment, the method of FIG. 6 can be performed by a processor that executes instructions, as described with respect to FIG. 7.

Figure 7:
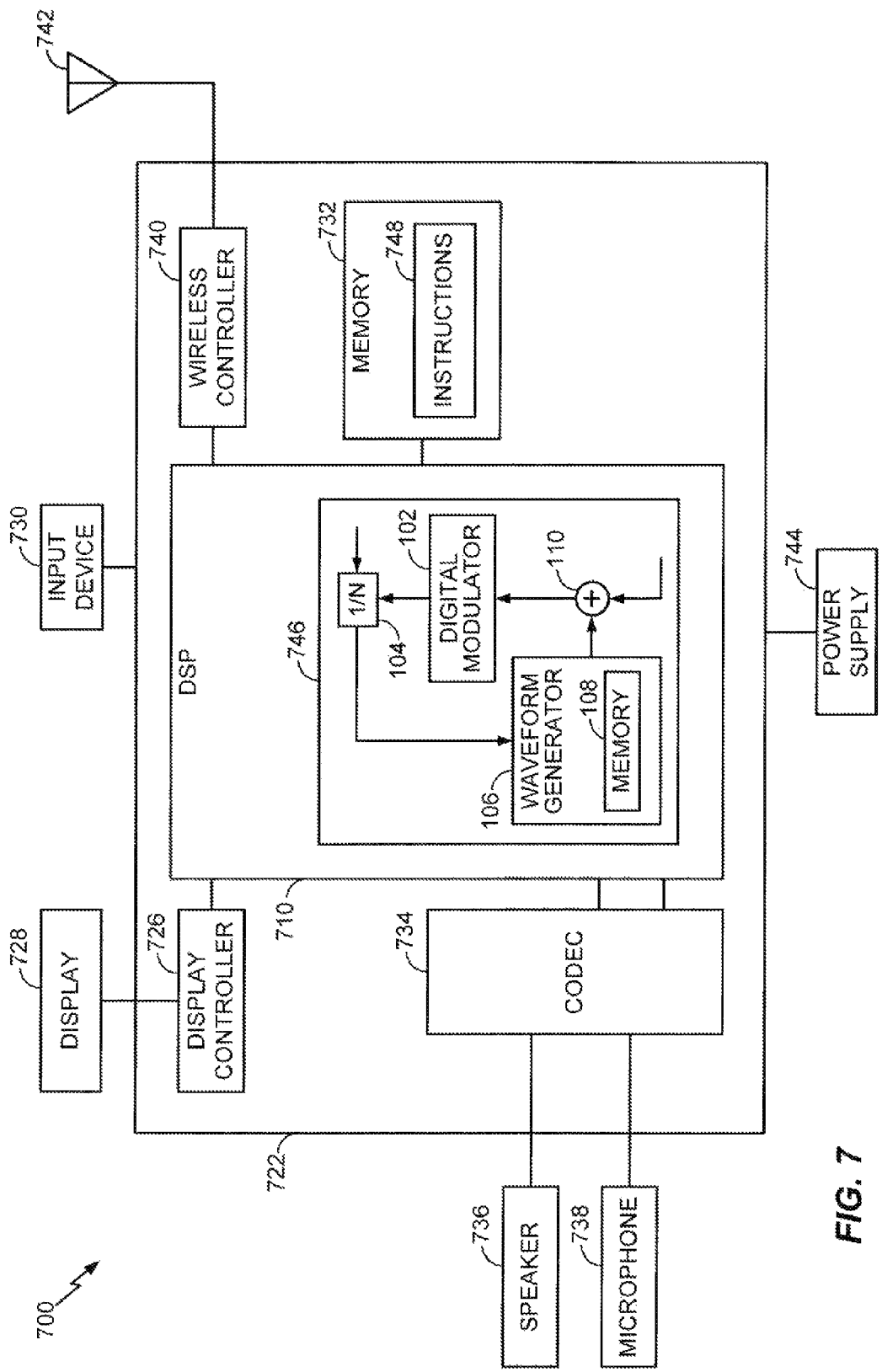
FIG. 7 is a block diagram of a wireless device including a digital circuit for generating a waveform from stored digital values to modulate a fixed seed value.

Referring to FIG. 7, a block diagram of a particular illustrative embodiment of an electronic device including a digital circuit to modulate a fixed seed value with a waveform generated from stored values is depicted and generally designated 700. The device 700 includes a processor, such as a digital signal processor (DSP) 710, coupled to a memory 732. The DSP 710 may include a digital circuit 746 to modulate a fixed seed value with a waveform generated from stored values. The digital circuit 746 includes a digital modulator 102 configured to drive a frequency divider (1/N) 104, a waveform generator 106 configured to receive an output of the frequency divider (1/N) 104, and an adder 110 configured to add the waveform generated by the waveform generator 106 and a fixed seed value, where the adder 110 provides a resulting sum to the digital modulator 102. The waveform generator 106 includes a memory 108 that may be configured to store digital values used to generate the waveform. In an illustrative example, the digital circuit 746 may be any of the digital circuits of FIGS. 1-3, may implement the method of FIG. 6, or any combination thereof.

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, the DSP 710, the display controller 726, the memory 732, the CODEC 734, the wireless controller 740, and digital circuit 746 are included in a system-in-package or system-on-chip device 722. In a particular embodiment, an input device 730 and a power supply 744 are coupled to the system-on-chip device 722. Moreover, in a patticular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller. Although the digital circuit 746 is shown in the DSP 710, in other embodiments, the digital circuit 746 may be external to the DSP 710 or external to the system-on-chip device 722.

The device 700 may include a non-transient computer readable tangible medium, such as the memory 732, for storing instructions 748 executable by a processor of a computer, such as the DSP 710. The instructions 748 may be executed by the computer to adjust an input to the frequency divider (1/N) 104 on a feedback path of a phase locked loop (PLL) based on a stored digital value (e.g., at the memory 108) representing a portion of a time-based waveform that is applied to a modulator circuit, such as the digital modulator 102. The stored digital value may be retrieved based on an output, such as the feedback clock from the frequency divider (1/N) 104, of the feedback path.

In a particular embodiment, in which the digital circuit 746 corresponds to the digital circuit 300 of FIG. 3, the output of the feedback path may be provided, via the data path 228, to the second frequency divider (1/K) 214 of FIG. 3 and the output of the feedback path may be divided by the second frequency divider (1/K) 214 and provided to the waveform generator 306 to generate the time-based waveform 124. The instructions 748 may be executable by the computer (e.g. DSP 710 or a different processor) to update the stored digital values 354 in the lookup table 308 to represent a customized waveform. For example, the DSP 710 may replace one or more stored digital values with data retrieved from the memory 732 or received via the input device 730 or the wireless antenna 742. The stored digital values 354 may be replaced or modified to form any shape waveform. Alternatively, or in addition, the lookup table 308 may include multiple sets of stored digital values 354, where each set represents a unique time-based waveform.

Figure 8:
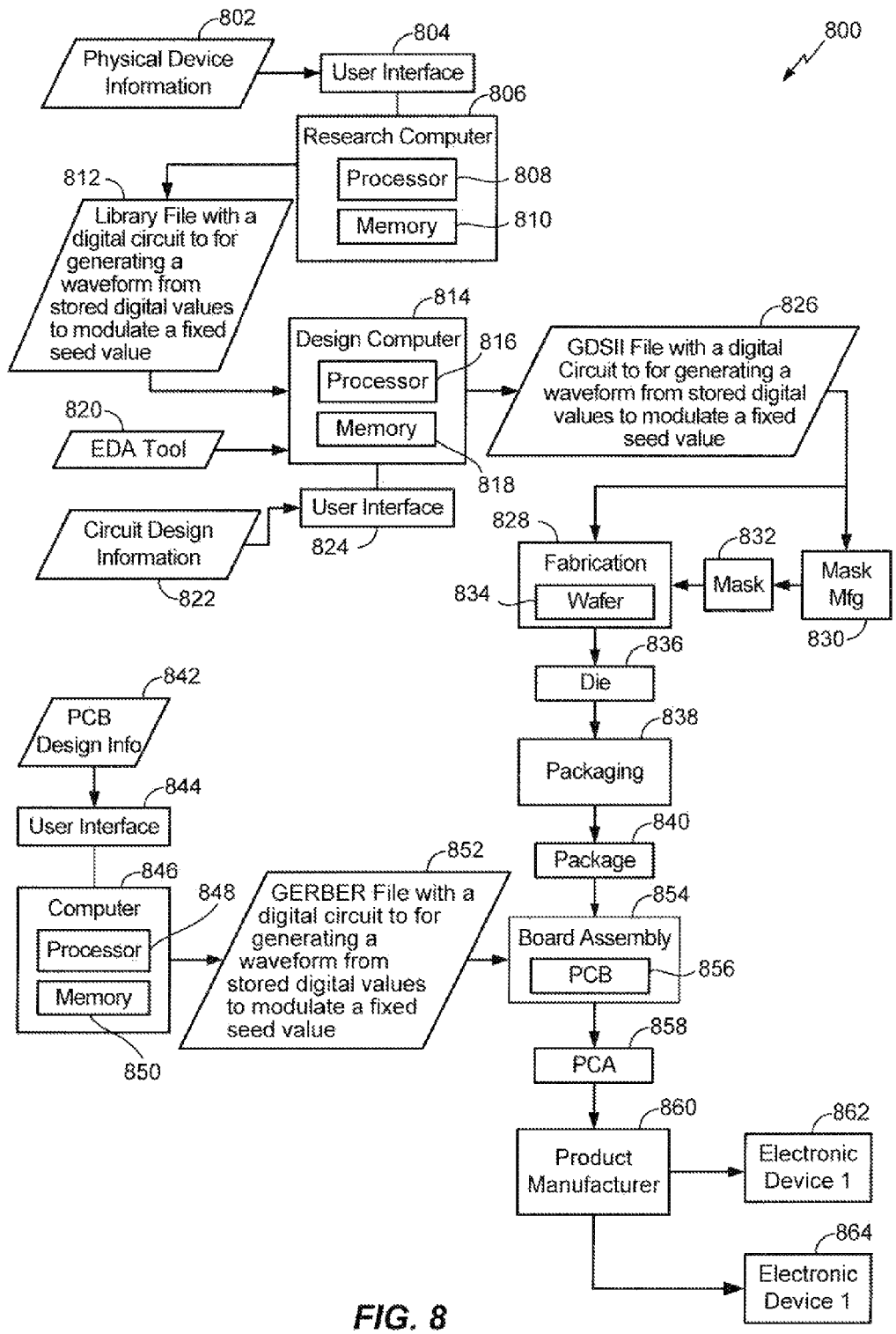
FIG. 8 is a data flow diagram illustrating a manufacturing process to manufacture a semiconductor device that includes a digital circuit for generating a waveform from stored digital values to modulate a fixed seed value.

The foregoing disclosed devices and functionalities may be designed and configured into computer files (e.g. RTL, GDSII, GERBER, etc.) stored on computer readable media. Some or all such files may be provided to fabrication handlers that fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received in the manufacturing process 800, such as at a research computer 806. The physical device information 802 may include design information representing at least one physical property of a semiconductor device, such as the digital circuit 100 of FIG. 1, the digital circuit 200 of FIG. 2, the digital circuit 300 of FIG. 3, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including transformed design information. For example, the library file 812 may include a library of semiconductor devices including the digital circuit 100 of FIG. 1, the digital circuit 200 of FIG. 2, the digital circuit 300 of FIG. 3, or any combination thereof, that is provided for use with an electronic design automation (EDA) tool 820. To illustrate, the library file 812 may include information corresponding to the digital circuit 300 of FIG. 3 to modulate a fixed seed value with a waveform generated from stored values.

The library file 812 may be used in conjunction with the EDA tool 820 at a design computer 814 including a processor 816, such as one or more processing cores, coupled to a memory 818. The FDA tool 820 may be stored as processor executable instructions at the memory 818 to enable a user of the design computer 814 to design a circuit of the library file 812, such as the digital circuit 100 of FIG. 1, the digital circuit 200 of FIG. 2, the digital circuit 300 of FIG. 3, or any combination thereof. For example, a user of the design computer 814 may enter circuit design information 822 via a user interface 824 coupled to the design computer 814. The circuit design information 822 may include design information representing at least one physical property of a semiconductor device, such as the digital circuit 100 of FIG. 1, the digital circuit 200 of FIG. 2, the digital circuit 300 of FIG. 3, or any combination thereof. To illustrate, the circuit design information may include identification of particular circuits and relationships to other elements in a circuit design, positioning information, feature size information, interconnection information, or other information representing a physical property of a semiconductor device.

The design computer 814 may be configured to transform the design information, including the circuit design information 822 to comply with a file format. To illustrate, file formation may include a database binary file format representing planar geometric shapes, text labels, and other information about a circuit layout in a hierarchical format, such as a Graphic. Data System (GDSII) file format. The design computer 814 may be configured to generate a data file including the transformed design information, such as a GDSII file 826 that includes information describing the digital circuit 100 of FIG. 1, the digital circuit 200 of FIG. 2, the digital circuit 300 of FIG. 3, or any combination thereof, in addition to other circuits or information. To illustrate, the data file may include information corresponding to a system-on-chip (SOC) that includes the digital circuit 300 and that also includes additional electronic circuits and components within the SOC.

The GDSII file 826 may be received at a fabrication process 828 to manufacture the digital circuit 100 of FIG. 1, the digital circuit 200 of FIG. 2, the digital circuit 300 of FIG. 3, or any combination thereof, according to transformed information in the GDSII file 826. For example, a device manufacture process may include providing the GDSII file 826 to a mask manufacturer 830 to create one or more masks, such as masks to be used for photolithography processing, illustrated as a representative mask 832. The mask 832 may be used during the fabrication process to generate one or more wafers 834, which may be tested and separated into dies, such as a representative die 836. The die 836 includes a circuit including the digital circuit 100 of FIG. 1, the digital circuit 200 of FIG. 2, the digital circuit 300 of FIG. 3, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the digital circuit 100 of FIG. 1, the digital circuit 200 of FIG. 2, the digital circuit 300 of FIG. 3, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the digital circuit 100 of FIG. 1, the digital circuit 200 of FIG. 2, the digital circuit 300 of FIG. 3, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines for performing various steps of a PCB production process.

The PCB 856 may be populated with electronic components including the package 840 to form a represented printed circuit assembly (PCA) 858.

The PCA 858 may be received at a product manufacture process 860 and integrated into one or more electronic devices, such as a first representative electronic device 862 and a second representative electronic device 864. As an illustrative; non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-3 and FIG. 7 may illustrate remote units according to the teachings of the disclosure, the disclosure is not limited to these illustrated units. Embodiments of the disclosure may be suitably employed in any device that includes active integrated'circuitry.

Thus, the digital circuit 100 of FIG. 1, the digital circuit 200 of FIG. 2, the digital circuit 300 of FIG. 3, or any combination thereof, may be fabricated, processed, and incorporated into an electronic device, as described in the illustrative process 800. One or more aspects of the embodiments disclosed with respect to FIGS. 1-3 may be included at various processing stages, such as within the library file 812, the GDSII file 826, and the GERBER File 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity, or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
providing a selected control input to a modulator circuit based on a control value at a multiplexer, wherein, when the control value is a first value, the selected control input includes a seed value and excludes a time-based waveform generated by a waveform generator based on a stored digital value; and
selectively adjusting an input to a divider on a feedback path of a phase locked loop circuit based, at least in part, on an output of the modulator circuit;
wherein the stored digital value is retrieved based on an output of the feedback path.

2. The method of claim 1, further comprising reading the stored digital value from a lookup table.

3. The method of claim 1, wherein, when a second control value at a second multiplexer is a third value, the input to the divider is adjusted based on a value associated with a source that is external to a die that includes the phase locked loop circuit.

4. The method of claim 2, wherein a lookup table index is used read the stored digital value from the lookup table.

5. The method of claim 1, wherein, when the control value is a second value, the selected control input is a combined value based on adding the seed value to the time-based waveform.

6. The method of claim 5, wherein the divider generates the output of the feedback path and wherein the output of the feedback path is divided by a second divider and provided to the waveform generator.

7. The method of claim 1, wherein the modulator circuit is a sigma-delta modulator circuit.

8. The method of claim 1, wherein adjusting the input to the divider is performed at a processor integrated into an electronic device.

9. A digital circuit comprising:
a digital modulator responsive to a seed input and having an output to drive a frequency divider;
a waveform generator coupled to an output of the frequency divider and including a memory that stores digital values used to generate a waveform; and
a multiplexer coupled to the waveform generator and to the digital modulator, wherein the seed input is provided to the digital modulator based on a control value at the multiplexer, wherein, when the control value is a first value, the seed input includes a fixed seed value and excludes the waveform.

10. The digital circuit of claim 9, wherein an input of the waveform generator is coupled to the output of the frequency divider via a second frequency divider.

11. The digital circuit of claim 9, wherein the memory includes a lookup table.

12. The digital circuit of claim 9, wherein the waveform is a sinusoid.

13. The digital circuit of claim 9, wherein the digital circuit is compliant with a Serial Advanced Technology Attachment (SATA) standard.

14. The digital circuit of claim 9, wherein a frequency of the waveform is in a range between approximately 30 kilohertz and approximately 33 kilohertz.

15. The digital circuit of claim 9, wherein, when the control value is a second value, the seed input is a combined value based on adding the fixed seed value to the waveform.

16. The digital circuit of claim 9, wherein the waveform is a non-triangular waveform having a corresponding frequency roll-off that is sharper than a frequency roll-off of a triangular waveform.

17. The digital circuit of claim 9, wherein the frequency divider is in a feedback path of a phase locked loop circuit.

18. The digital circuit of claim 17, wherein the phase locked loop circuit comprises a voltage controlled oscillator, a low-pass filter, a charge pump, and a phase frequency detector.

19. The digital circuit of claim 9, wherein the output of the frequency divider is configured to provide a feedback clock signal to an input of a second frequency divider, wherein an output of the second frequency divider is coupled to provide a divided feedback clock signal to a clock input of the waveform generator, and wherein the waveform generator is configured to use a lookup table index to read a stored digital value from the memory.

20. The digital circuit of claim 9 integrated in at least one semiconductor die.

21. The digital circuit of claim 9, further comprising a device selected from the group consisting of a set top box, a music player, a video player, an entertainment unit, a navigation device, a communications device, a personal digital assistant (PDA), a fixed location data unit, and a computer, into which the waveform generator is integrated.

22. A digital circuit comprising:
means for modulating a seed input to drive a frequency divider;
means for generating a waveform coupled to an output of the frequency divider;
means for storing digital values used to generate the waveform; and
means for selecting the seed input, wherein the seed input is selected based on a control value provided to the means for selecting, wherein, when the control value is a first value, the seed input includes a fixed seed value and excludes the waveform.

23. The digital circuit of claim 22, wherein the means for storing digital values includes a lookup table.

24. The digital circuit of claim 22, wherein the waveform is a sinusoid.

25. The digital circuit of claim 22, wherein, when the control value is a second value, the seed input is a combined value based on adding the fixed seed value to the waveform.

26. The digital circuit of claim 22, wherein the frequency divider is in a feedback path of a phase locked loop circuit.

27. The digital circuit of claim 22 integrated in at least one semiconductor die.

28. The digital circuit of claim 22, further comprising a device selected from the group consisting of a set top box, a music player, a video player, an entertainment unit, a navigation device, a communications device, a personal digital assistant (PDA), a fixed location data unit, and a computer, into which the means for generating the waveform is integrated.

29. A method comprising:
a step for reading a stored digital value from a lookup table;
a step for providing a selected control input to a modulator circuit based on a control value at a multiplexer, wherein, when the control value is a first value, the selected control input includes a seed value and excludes a time-based waveform, and wherein the stored digital value represents a portion of the time-based waveform; and
a step for adjusting an input to a divider in a feedback path of a phase locked loop circuit based on an output of the modulator circuit;
wherein the stored digital value is retrieved based on an output of the feedback path.

30. The method of claim 29, further comprising:
a step for updating stored values in the lookup table to represent a customized waveform.

31. The method of claim 29, wherein, when the control value is a second value, the selected control input is a combined value based on adding a seed value to the time-based waveform.

32. The method of claim 31, wherein the divider generates the output of the feedback path and wherein the output of the feedback path is divided by a second divider and provided to a waveform generator operative to generate the time-based waveform.

33. The method of claim 29, wherein the step for adjusting the input to the divider is performed by a processor integrated into an electronic device.

34. A non-transient computer readable tangible medium storing instructions executable by a computer, the instructions comprising:
instructions that are executable by the computer to provide a selected control input to a modulator circuit based on a control value at a multiplexer, wherein, when the control value is a first value, the selected control input includes a seed value and excludes a time-based waveform generated by a waveform generator based on a stored digital value; and
instructions that are executable by the computer to adjust an input to a divider in a feedback path of a phase locked loop circuit based on an output of the modulator circuit;
wherein the stored digital value is retrieved based on an output of the feedback path.

35. The computer readable tangible medium of claim 34, further comprising instructions that are executable by the computer to update stored values in a lookup table to represent a customized waveform.

36. The computer readable tangible medium of claim 34, wherein the output of the feedback path is provided to a second divider, and wherein the output of the feedback path is divided by the second divider and provided to the waveform generator.

37. The computer readable tangible medium of claim 34, wherein the instructions are executable by a processor integrated in a device selected from the group consisting of a set top box, a music player, a video player, an entertainment unit, a navigation device, a communications device, a personal digital assistant (PDA), and a fixed location data unit.

38. A method comprising:
receiving a data file comprising design information corresponding to a semiconductor device; and
fabricating the semiconductor device according to the design information, wherein the semiconductor device comprises:
a digital modulator responsive to a seed input and having an output to drive a frequency divider;
a waveform generator coupled to an output of the frequency divider and including a memory that stores digital values used to generate a waveform; and
a multiplexer coupled to the waveform generator and to the digital modulator, wherein the seed input is provided to the digital modulator based on a control value at the multiplexer, wherein, when the control value is a first value, the seed input includes a fixed seed value and excludes the waveform.

39. The method of claim 38, wherein the data file, has a Graphic Database System II (GDSII) format.

40. The method of claim 38, wherein the data file has a GERBER format.

* * * * *